United States Patent
Vasat et al.

(10) Patent No.: US 6,376,395 B2
(45) Date of Patent: *Apr. 23, 2002

(54) SEMICONDUCTOR WAFER MANUFACTURING PROCESS

(75) Inventors: Jiri L. Vasat, Chesterfield; Andrei Stefanescu, O'Fallon; Thomas M. Hanley, St. Charles, all of MO (US)

(73) Assignee: MEMC Electronic Materials, Inc., St. Peters, MO (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/481,080

(22) Filed: Jan. 11, 2000

(51) Int. Cl.[7] ............................................. H01L 21/26
(52) U.S. Cl. ................... 438/795; 438/799; 438/690; 451/41
(58) Field of Search ........................... 451/41; 438/795, 438/799, 690, 691, 692

(56) References Cited

U.S. PATENT DOCUMENTS

| | | | | |
|---|---|---|---|---|
| 4,548,654 A | * | 10/1985 | Tobin ........................... | 148/1.5 |
| 4,851,358 A | * | 7/1989 | Huber ........................... | 437/10 |
| 5,316,620 A | * | 5/1994 | Masegawa et al. ........... | 438/502 |
| 5,340,437 A | | 8/1994 | Erk et al. ..................... | 156/639 |
| 5,429,711 A | | 7/1995 | Watanabe et al. ............ | 216/52 |
| 5,506,176 A | | 4/1996 | Takizawa | |
| 5,629,216 A | * | 5/1997 | Wijaranakula et al. ...... | 438/502 |
| 5,744,401 A | | 4/1998 | Shirai et al. | |
| 5,776,219 A | * | 7/1998 | Jinbo et al. .................. | 65/31 |
| 5,800,577 A | * | 9/1998 | Kido ............................ | 51/307 |
| 5,931,662 A | | 8/1999 | Adachi et al. ................ | 432/6 |
| 5,932,022 A | * | 8/1999 | Linn et al. ................... | 134/2 |
| 6,066,565 A | | 5/2000 | Kuroki et al. | |
| 6,074,947 A | * | 6/2000 | Mumola ....................... | 438/689 |

FOREIGN PATENT DOCUMENTS

| | | |
|---|---|---|
| EP | 0536958 A1 | 4/1993 |
| EP | 0553852 A2 | 8/1993 |
| EP | 0964443 A2 | 12/1999 |
| JP | 11154655 | 8/1999 |
| WO | WO9838675 | 9/1998 |

OTHER PUBLICATIONS

International Search Report for PCT/US00/33571.

* cited by examiner

Primary Examiner—Matthew Smith
Assistant Examiner—Renzo N. Rocchegiani
(74) Attorney, Agent, or Firm—Senniger, Powers, Leavitt & Roedel (57) ABSTRACT

A process for manufacturing polished-like first-grade semiconductor wafers is disclosed. The process greatly simplifies the amount of polishing required while producing high quality semiconductor wafers. After a semiconductor wafer is sliced from a single crystal ingot, lapped and ground, the wafer is subjected to a double side fine grinding operation, a micro-etching operation, and an annealing operation to significantly improve the quality of the front surface. To complete to process the semiconductor wafer is flash polished to impart a specular finish on the front surface. In accordance with the present invention the semiconductor wafers may also be produced having a denuded zone capable of internal gettering.

21 Claims, 4 Drawing Sheets

SEMICONDUCTOR WAFER MANUFACTURING PROCESS

BACKGROUND OF THE INVENTION

The present invention relates to a process for preparing polished-like first-grade semiconductor wafers. More particularly, the present invention relates to a process for preparing polished-like semiconductor wafers from low cost single silicon crystals by eliminating the long, costly polishing steps generally required to produce such wafers.

Single crystal silicon is the starting material for most processes for the fabrication of semiconductor electronic components and is commonly prepared with the so-called Czochralski process. In this process, a crystal pulling apparatus purged with a continuous stream of argon is utilized wherein polycrystalline silicon ("polysilicon") is charged to a quartz crucible, the polysilicon is melted, a seed crystal is immersed into the molten silicon and a single crystal silicon ingot is grown by slow extraction.

Silicon wafers are generally manufactured from the grown silicon ingots by a multi-step processing sequence that begins with the slicing of the crystal ingots using a wire-saw or internal diameter saw. The sliced wafers are then generally subjected to flattening steps to reduce total thickness variation across the front surface of the wafer. Conventional steps may include lapping, grinding, and etching to remove mechanical damage and contamination. After a cleaning process the wafers are generally polished on one or both sides. The polishing of the wafers, which is generally composed of rough and finish polishing steps, is one of the more expensive and time consuming part of the wafer manufacturing process.

To increase overall throughput and reduce cost, it is desirable to grow the single crystal silicon ingots as quickly as possible, while attempting to limit the amount and type of defects generated by faster cooling times. During fast cooling of fast pull or continuous pull single silicon crystals (i.e., crystals grown under vacancy rich conditions) agglomeration of vacancies results in the formation of crystal originated pits/particles (COPs), surface defects, dislocations, and oxygen stacking fault (OSF) nuclei in the wafer bulk and at the wafer surfaces. Several approaches to minimize or eliminate these problems have been advanced in the prior art including the deposition of a high quality epitaxial film to cover defects (generally referred to as "EPI-II" layers), slower cooling of crystals to control the size and number density of defects, defect suppression during crystal growth, as well as various high temperature annealing steps in different gas atmospheres (U.S. Pat. No. 5,931,662).

Although the aforementioned processes have had some success in minimizing COPs, surface defects, dislocations and OSF nuclei, they are generally expensive, time consuming processes which reduce overall throughput and increase costs. As such, a need exists in the semiconductor industry for a high-throughput wafer manufacturing process capable of producing polished-like final semiconductor wafers in an efficient, cost-efficient manner.

SUMMARY OF THE INVENTION

Among the objects of the present invention, therefore, are the provision of a high throughput wafer manufacturing process; the provision of a wafer manufacturing process which greatly simplifies the polishing process; the provision of a wafer manufacturing process which reduces overall costs; the provision of a wafer manufacturing process which reduces COPs, surface defects and OSF nuclei at the semiconductor wafer surface; and the provision of a semiconductor wafer manufacturing process which produces a wafer having a denuded zone and internal gettering.

Briefly, therefore, the present invention is directed to a process for manufacturing a semiconductor wafer having a front surface and a back surface from a single crystal ingot. The process comprises first annealing a wafer in a gas ambient to reduce the surface roughness on the front surface of the wafer. Prior to the annealing step, the front surface has a surface roughness of between about 3 nanometers RMS and about 10 nanometers RMS and after the annealing the front surface has a roughness of between about 1 nanometer RMS and about 8 nanometers RMS. Finally, the front surface of the wafer is polished to create a specular finish on the front surface.

The present invention is further directed to a process for manufacturing a semiconductor wafer sliced from a single-crystal ingot. The semiconductor wafer is double side fine ground to improve the thickness uniformity of the wafer and reduce imparted damage and waviness. Next, the front surface is micro-etched to remove embedded particles and damage and reduce the mechanical stress on the wafer. The wafer is finally annealed in a gas ambient to improve the quality of the front surface and polished to create a specular finish on the front surface of the wafer.

The present invention is still further directed to a process for manufacturing a semiconductor wafer sliced from a single crystal ingot. The wafer is first sliced from a single crystal ingot and lapped/rough ground to reduce waviness and improve flatness. Next, the wafer is double side fine ground to improve thickness uniformity and reduce damage and waviness and micro-etched on the front surface to remove embedded particles and damage on the front surface. Next, an operation is performed on the wafer to create denuded zones in the wafer and the wafer is then annealed in a gas ambient to improve the quality of the front surface of the wafer. Finally, the front surface is polished to create a specular finish on the front surface.

Other objects and features of this invention will be in part apparent and in part pointed out hereinafter.

DETAILED DESCRIPTION OF THE PREFERRED EMBODIMENTS

In accordance with the present invention, it has been discovered that high quality polished-like semiconductor wafers ready for device fabrication can be produced from low cost crystal (such as fast pull CZ or continuous pull CZ crystals, for example) in an expedient, cost-effective manner by greatly simplifying the polishing process utilizing double side fine grinding and micro-etching, followed by annealing. Surprisingly, the annealing operation significantly reduces COPs and other surface defects on and near the wafer surface, as well as OSF nuclei density at or near the wafer surface left after micro-etching. This process of replacing costly polishing steps with grinding, micro-etching, and annealing results in first grade polished-like a wafers at reduced cost. Furthermore, the process can produce low cost first-grade semiconductor wafers having denuded zones and internal gettering which can be manipulated through control of process parameters.

Figure 1:
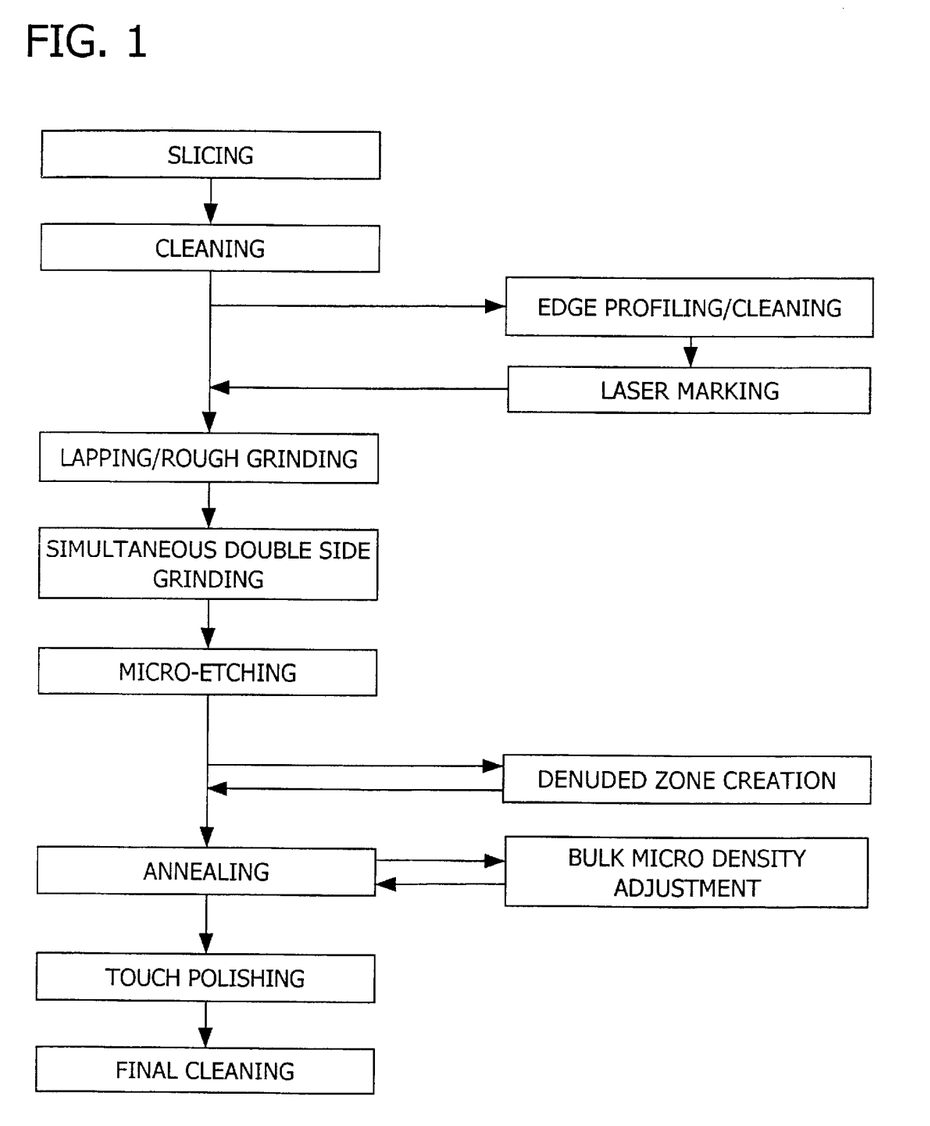
FIG. 1 is a flow diagram showing a method of manufacturing a semiconductor wafer in accordance with the present invention.
Figure 2A:
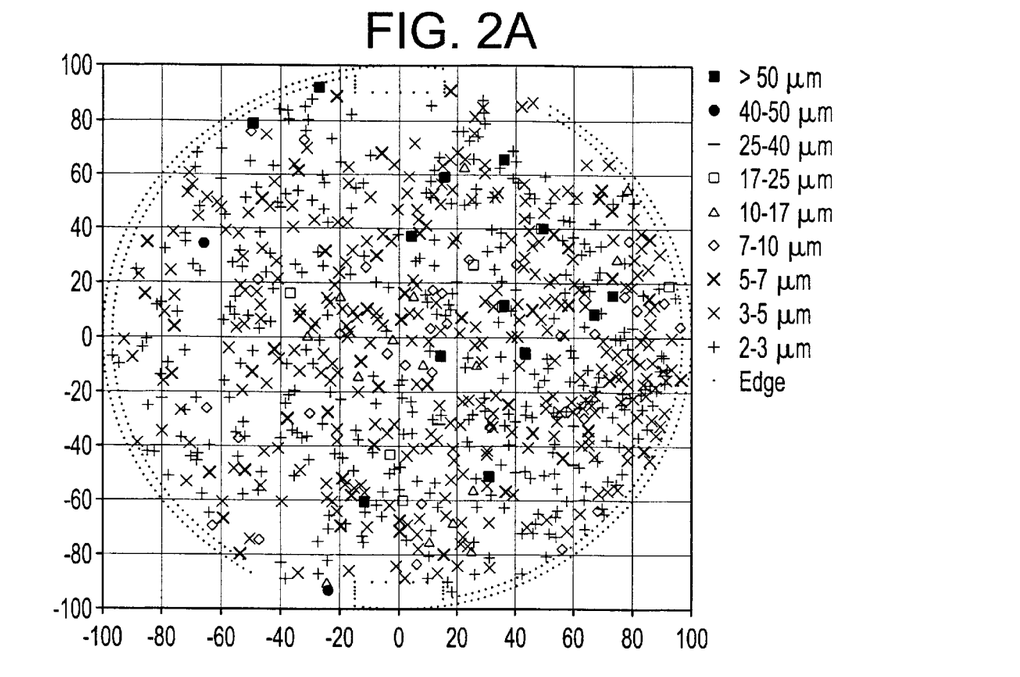
FIG. 2 shows two maps of the front surface of the same micro-etched semiconductor wafer, one before the annealing process and one after the annealing process of the present invention.
Figure 2B:
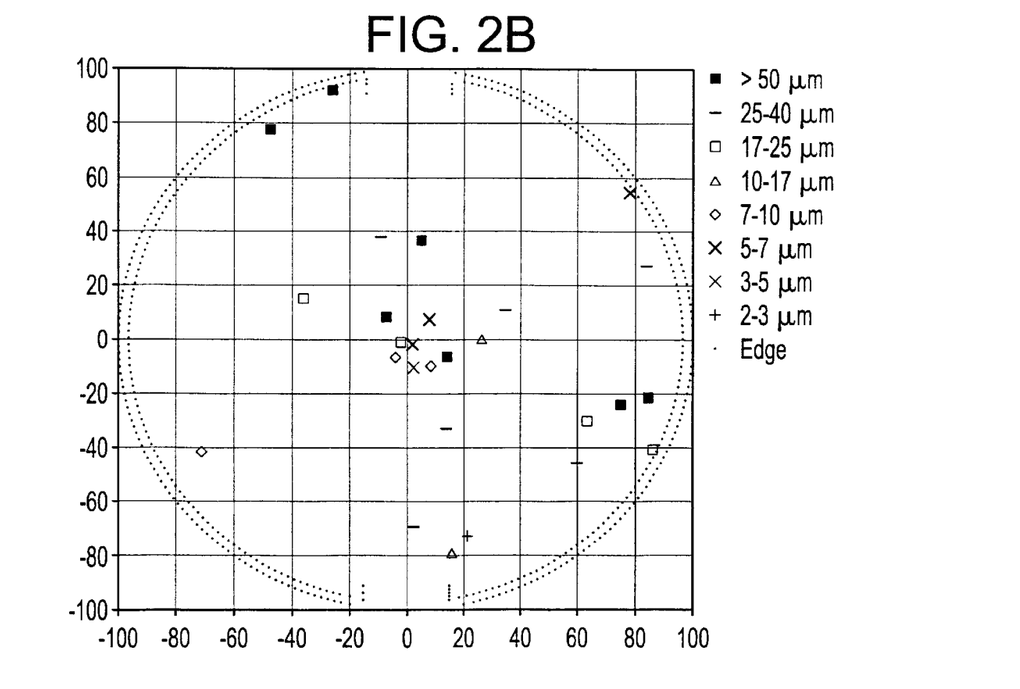

Referring now to the Figures, and more particularly to FIG. 1, there is shown a flow chart detailing the process steps of the present invention to produce polished-like semiconductor wafers. As indicated in FIG. 1, the semiconductor wafer is sliced from a single-crystal ingot utilizing a conventional internal diameter saw or wire saw to produce a thin wafer disk having a predetermined initial thickness. The wafer has a front surface and a back surface, and for purposes of this invention the front surface is defined as the surface upon which devices are ultimately printed. The initial thickness of each wafer is substantially greater than the desired end thickness to allow subsequent processing operations to reduce the thickness of the wafer without the risk of permanently damaging or fracturing the wafer. For example, the initial thickness of the wafer may be between about 800 and about 1200 micrometers.

After slicing, the semiconductor wafer is generally subjected to a cleaning operation to remove particulate matter deposited on the wafer during the slicing operation. This cleaning process may include sequential tanks of etching solution, cleaning solution and water rinses. Approximately 2 to 10 micrometers of material is removed from both the front and the back surfaces of the semiconductor wafer during cleaning. At this stage of the manufacturing process, the peripheral edge of the wafer may also be profiled by a conventional edge grinder to reduce the risk of damage to the wafer during further processing. The wafer is generally cleaned after profiling in a similar manner as described above. The wafer may then be optionally marked by laser for identification prior to the next operation.

Again referring to FIG. 1, the semiconductor wafer is next subjected to a lapping/rough grinding operation. The combination lapping/rough grinding operation reduces waviness in the wafer and improves overall flatness. Also, the combination lapping/rough grinding begins to remove some semiconductor wafer surface damage imparted on the wafer during prior processing steps such as slicing. This combination of lapping/rough grinding is conventional and well known to those skilled in the art. (See Watanabe et. al U.S. Pat. No. 5,429,711).

The wafer is next subjected to a grinding operation for ultimately fine grinding both the front and back surfaces of the semiconductor wafer to improve the thickness uniformity of the wafer and reduce damage and waviness caused by the slicing and lapping/rough grinding operations. Preferably, the grinding operation is a simultaneous double side grinding (SDSG)operation. For carrying out a SDSG operation a suitable apparatus is the Model No. DXSG300 manufactured by Koyo Machine Industries Co., Ltd. of Japan (Koyo machine), or Model No. MPG-300 Nippei Toyama Corp., of Japan (NTC machine), for example. Each wafer is positioned between the oppositely positioned grinding wheels, with one of the wafer surfaces resting against one of the grinding wheels. During the operation, one of the wheels is infed toward the wafer while both grinding wheels and the wafer are rotating. Typically, the infed grinding wheel is infed at a rate of about 0.01 to 0.45 mm/min. The SDSG operation may include rough and intermediate grinding steps prior to the final finish double side grinding step.

With respect to the Koyo machine, the rough grinding step is conducted preferably at an infeed rate of about 0.15 to about 0.45 mmi/min, more preferably about 0.3 mm/min, the intermediate step at a rate of about 0.06 to about 0.18 mm/min, more preferably about 0.12 mm/min and the finish step at a rate of about 0.03 to about 0.09 mm/min, more preferably about 0.06 mm/min. With respect to the NTC machine, the rough grinding step is conducted preferably at an infeed rate of about 0.03 to about 0.09 mm/min, more preferably about 0.06 mm/min, the intermediate step at a rate of about 0.025 to about 0.08 mm/min, more preferably about 0.055 mm/min and the finish step at a rate of about 0.01 to about 0.03 mm/min, more preferably about 0.02 mm/min. With respect to the Koyo machine, the grinding wheels are preferably turned at a rate of about 1200 to about 3600 rotations per minute (rpm), more preferably at a rate of about 2200 to 2600 rpm, and even more preferably at a rate of about 2380 rpm, which results in an edge speed of about 1495 mmin. Also, the semiconductor wafer preferably rotates at a speed of about 10 to about 30 rpm, more preferably between about 15 and about 25 rpm, and even more preferably about 21 rpm in the Koyo machine. With respect to the NTC machine, the grinding wheels are preferably turned at a rate of about 2000 to about 4000 rpm, more preferably at a rate of about 2800 to about 3200 rpm and even more preferably at a rate of about 2995 to about 3000 rpm, with results in an edge speed of about 1412 m/min. The semiconductor wafer preferably rotates at about 10 to about 30 rpm, more preferably at a rate of about 18 to about 22 rpm and even more preferably at about 20 rpm in the NTC machine.

Typically, the grinding wheels have grains preferably sized in the range of about 2 to about 10 micrometers, and more preferably about 4 to about 6 micrometers. The SDSG operation removes a predetermined thickness of wafer material, preferably between about 10 to about 90 micrometers of total wafer thickness, more preferably between about 30 and about 75 micrometers total thickness, and even more preferably about 60 micrometers total thickness. Wafers produced by this grinding process preferably have a root mean square surface roughness, RMS, of about 5–10 nanometers over a 1 millimeter scan length. The SDSG operation helps remove damage on the semiconductor wafer caused by the slicing and other prior operations, and also begins to remove a portion of the sub-surface damage in the semiconductor wafer. As will be recognized by one skilled in the art, the alignment of the wheels of the SDSG apparatus must be closely monitored and controlled so that the surfaces of the wafer are evenly ground. After the SDSG operation, the wafer is generally cleaned at a conventional cleaning bench well known to those skilled in the art.

After the SDSG operation is complete, the semiconductor wafer is subjected to a micro-etching operation on the front surface of the semiconductor wafer. The SDSG operation leaves small scratches and dislocations on the semiconductor wafer surfaces, and also exposes COPs and OSF nuclei. The micro-etching operation helps remove embedded particles and damage on the semiconductor surface as well as reduce the mechanical stress on the wafer surfaces left from the SDSG operation.

In the micro-etching operation the front surface of the wafer is micro-etched with an aqueous solution comprising hydrofluoric acid (HF) and an oxidizing agent which consistently yields a wafer surface having improved gloss and smoothness. Suitable oxidizing agents for the micro-etching operation in accordance with the present invention are manganese and chromium based; more specifically, suitable oxidizing agents include those capable of forming permanganate ions ($MnO_4-$), chromate ions ($CrO_4^{2-}$), and dichromate ions ($Cr_2O_7^{2-}$) in solution, as well chromium trioxide ($CrO_3$) and mixtures thereof Oxidizing agents capable of forming permanganate ions in solution, such as potassium permanganate ($KMnO_4$) or sodium permanganate ($NaMnO_4$), are preferred, in part due to their less hazardous nature.

The aqueous etching solution of the present invention typically comprises between about 10 and about 50 weight percent hydrofluoric acid, and between about 0.2 and about 6 weight percent of an oxidizing agent. Preferably, the aqueous solution comprises between about 30 and about 40 weight percent hydrofluoric acid, and between about 1 and about 2 weight percent of an oxidizing agent. Most preferably, however, the aqueous solution comprises between about 30 and about 35 weight percent hydrofluoric acid and between about 1 and about 1.5 weight percent of an oxidizing agent. In one preferred embodiment, the aqueous solution comprises about 33 weight percent hydrofluoric acid and about 1 weight percent potassium permanganate.

Usually, the hydrofluoric acid and oxidizing agent are dissolved in water forming an aqueous HF solution and an aqueous oxidizing agent solution and then the solutions are mixed together to produce an etching solution with the desired composition. For example, a typical aqueous HF solution will consist essentially of water and about 50 weight percent hydrofluoric acid, whereas the oxidizing agent is generally added to the etching solution as a 1 N aqueous solution. The two solutions are then mixed to form an etching solution wherein the weight ratio of oxidizing agent to hydrofluoric acid is from about 0.01 to about 0.1. Preferably, the weight ratio of oxidizing agent to hydrofluoric acid is from about 0.03 to about 0.05. The ratio of oxidizing agent to hydrofluoric acid determines the etch rate of the solution, the gloss and roughness of an etched wafer. However, it is to be understood that the concentration of hydrofluoric acid and the oxidizing agent in the present aqueous etching solution may be other than that herein described without departing from the scope of the present invention.

Preferably the micro-etching process of the present invention comprises partially, and more preferably fully, immersing the wafer into a bath of the etchant solution. (See, e.g., U.S. Pat. No. 5,340,437.) Although one wafer at a time may be immersed in the solution, preferably a number of wafers (e.g., 25 or more) will be assembled in a cassette, or wafer carrier, and immersed at the same time in the solution. When such a carrier is used, however, certain portions of each stationary wafer will be in constant contact with the carrier, resulting in nonuniform etching across the surface of each wafer. To eliminate this problem and provide a more uniform result over the entire wafer surface, the wafers are preferably rotated while immersed in the etchant solution.

In order to produce uniformly etched wafers and to ensure consistent results from one set of wafers to the next, it is preferred that the etchant solution be continuously mixed or agitated for the duration of the etching process. Bath agitation or mixing may be achieved by means known in the art, such as by employing ultrasonic agitation, stirring devices and pumps. Preferable, however, agitation is achieved by passing or "bubbling" a gas through the etchant solution (see, e.g., U.S. Pat. No. 5,340,437). Generally, any gas which will not react with the wafer surface may be employed, including elemental gases (e.g., hydrogen, nitrogen, oxygen), noble gases (e.g., helium or argon) or compound gases (e.g., carbon dioxide).

The micro-etching operation of the present invention typically involves contacting the wafer surface with the aqueous etchant solution for about 1 to about 10 minutes, and preferably for about 2 to about 5 minutes at room temperature (i.e. about 20° C. to about 25° C.). While a standard nitric acid-based etchant typically removes about 10–15 $\mu$m of silicon from each side of a wafer and produces a surface roughness of about 0.08 to about 0.13 $\mu$m RA over a scan length of about 1 millimeter, the present process achieves generally the same roughness by removing less than about 8 $\mu$m, and preferably only about 2 $\mu$m to about 5 $\mu$m, per side. The removal of less silicon from the surface is advantageous because it allows for a more uniformly flat wafer to be obtained. After the micro-etching operation is complete, the front surface of the wafer typically contains between about 20 and about 3000, preferably about 1500 COP surface defects and has a surface roughness of between about 3 nanometers and about 10 nanometers RMS over a scan length of about 1 millimeter.

After the micro-etching operation is complete, but before further processing, the semiconductor wafer may optionally be subjected to a process for creating a denuded zone (i.e. a non-uniform depth distribution of oxygen precipitates ) of sufficient depth and a wafer bulk containing a sufficient density of oxygen precipitates for internal gettering during device manufacturing. To create a semiconductor wafer having a denuded zone and wafer bulk containing oxygen precipitates for internal gettering several steps are required.

First, the wafer is subjected to a heat-treatment step in which the wafer is heated to an elevated temperature to form and thereby increase the number density of crystal lattice vacancies in the wafer. Preferably, this heat-treatment step is carried out in a rapid thermal annealer in which the wafer is rapidly heated to a target temperature and annealed at that temperature for a relatively short period of time. In general, the wafer is subjected to a temperature in excess of 1150° C., preferably at least 1175° C., more preferably at least about 1200° C., and most preferably between about 1200° C. and 1275° C.

The rapid thermal annealing step is carried out in the presence of an argon or nitrogen atmosphere. An increase in vacancy concentration throughout the wafer is achieved nearly, if not immediately, upon achieving the annealing temperature; annealing the wafer at this temperature in the argon or nitrogen atmosphere will further increase the vacancy concentration. Thus, the wafer will generally be maintained at this temperature for at least one second, typically for at least several seconds (e.g., at least 3) or even several tens of seconds of seconds and, depending upon the desired characteristics of the wafer and the atmosphere in which the wafer is being annealed, for a period which may range up to about 60 seconds (which is near the limit for commercially available rapid thermal annealers).

In general, annealing the wafer in a rapid thermal annealer in the presence of an argon or nitrogen atmosphere produces a non-uniform vacancy concentration (number density) profile in the wafer with the peak concentration occurring within about 50 to 100 micrometers of the surface which is exposed to the argon or nitrogen gas and a lesser and relatively uniform concentration in the wafer bulk. If the front and back surfaces of the wafer are exposed to the gas atmosphere during the rapid thermal annealing step, therefore, the resulting wafer will have a vacancy concentration (number density) profile which is generally "U-shaped" for a cross-section of the wafer, that is, a maximum concentration will occur within several micrometers of each of the front and back surfaces and a relatively constant and lesser concentration will occur throughout the wafer bulk.

Experimental evidence obtained to-date suggests that the atmosphere in which the rapid thermal annealing step is carried out should have an essential absence of oxygen in order for the build-up of vacancies to occur. That is, the atmosphere should have a total absence of oxygen or a partial pressure of oxygen which is insufficient to inject sufficient quantities of silicon self-interstitial atoms which suppress the build-up of vacancy concentrations. The lower limit of oxygen concentration has been determined to be about 500 ppm. It has also been demonstrated that for oxygen concentrations up to about 2000 ppm no increase in vacancy concentration is observed.

In addition to causing the formation of crystal lattice vacancies, the rapid thermal annealing step causes the dissolution of any unstabilized oxygen precipitate nucleation centers which are present in the silicon starting material. These nucleation centers may be formed, for example, during the growth of the single crystal silicon ingot from which the wafer was sliced or as a consequence of some other event in the previous thermal history of the wafer or of the ingot from which the wafer is sliced. Thus, the presence or absence of these nucleation centers in the starting material is not critical, provided these centers are capable of being dissolved during the rapid thermal annealing step.

The rapid thermal anneal may be carried out in any of a number of commercially available rapid thermal annealing ("RTA") furnaces in which wafers are individually heated by banks of high power lamps. RTA furnaces are capable of rapidly heating a silicon wafer, e.g., they are capable of heating a wafer from room temperature to 1200° C. in a few seconds. One such commercially available RTA furnace is the model 2800 furnace available from STEAG AST Electronic GmbH (Dornstadt, Germany).

Crystal lattice vacancies, like metals and other elements, are capable of diffusing through single crystal silicon with the rate of diffusion being temperature dependant. For example, crystal lattice vacancies are relatively mobile at temperatures in the vicinity of the temperature at which the wafer is annealed in the rapid thermal annealing step whereas they are essentially immobile for any commercially practical time period at temperatures of as much as 700° C. Experimental evidence obtained to-date suggests that the diffusion rate of vacancies slows considerably at temperatures less than about 700° C. and perhaps as great as 800° C., 900° C., or even 1,000° C., the vacancies can be considered to be immobile for any commercially practical time period.

Upon completion of the rapid thermal annealing, the wafer is rapidly cooled through the range of temperatures at which crystal lattice vacancies are relatively mobile in the single crystal silicon. As the temperature of the wafer is decreased through this range of temperatures, the vacancies diffuse to the oxide layer and become annihilated, thus leading to a change in the vacancy concentration profile with the extent of change depending upon the length of time the wafer is maintained at a temperature within this range. If the wafer were held at this temperature within this range for an infinite period of time, the vacancy concentration would once again become substantially uniform throughout the wafer bulk with the concentration being an equilibrium value which is substantially less than the concentration of crystal lattice vacancies immediately upon completion of the heat treatment step. By rapidly cooling the wafer, however, a non-uniform distribution of crystal lattice vacancies can be achieved with the maximum vacancy concentration being at or near central plane of the wafer and the vacancy concentration decreasing in the direction of the front surface and back surface of the wafer. In general, the average cooling rate within this range of temperatures is at least about 5° C. per second, preferably at least about 20° C. per second, more preferably at least about 50° C. per second, still more preferably at least about 100° C. per second, with cooling rates in the range of about 100° C. to about 200° C. per second being presently most preferred. Once the wafer is cooled to a temperature outside the range of temperatures at which crystal lattice vacancies are relatively mobile in the single crystal silicon, the cooling rate does not appear to significantly influence the precipitating characteristics of the wafer and thus, does not appear to be narrowly critical.

Conveniently, the cooling step may be carried out in the same atmosphere in which the heating step is carried out. Alternatively, the wafer may be cooled in an oxygen containing atmosphere. After the wafer has been cooled it is ready for continued wafer processing and use in an electronic device manufacturing process.

The concentration of oxygen precipitates is primarily a function of the heating step and secondarily a function of the cooling rate. In general, the concentration of oxygen precipitates increases with increasing temperature and increasing annealing times in the heating step with precipitate densities in the range of about $1 \times 10_7$ to about $5 \times 10^{10}$ precipitates/cm$^3$ being routinely obtained.

The depth from the front and back surfaces of oxygen precipitate-free material (denuded) zones is primarily a function of the cooling rate through the temperature range at which crystal lattice vacancies are relatively mobile in silicon. In general, the depth decreases with decreasing cooling rates with denuded zone depths of at least about 20, 30, 40, 50, 70 or even 100 micrometers being attainable. Significantly, the depth of the denuded zone is essentially independent of the details of the electronic device manufacturing process and, in addition, does not depend upon the out-diffusion of oxygen as is conventionally practiced. While the heat treatments employed in this process may result in the out-diffusion of a small amount of oxygen from the surface of the front and back surfaces of the wafer, the wafer bulk at depths of at least 5 micrometers from the wafer surface will have a substantially uniform oxygen concentration. Nevertheless, a denuded zone of substantially greater depth can be formed as a consequence of the cooling step which caused the formation of a non-uniform distribution of crystal lattice vacancies in the wafer.

Unlike prior methods used to form denuded zones, it is unnecessary to subject the single crystal silicon to a high temperature step to cause the outdiffusion of oxygen in regions near the surface of the silicon. Such high temperature steps when carried out for the sole purpose of forming a denuded zone add significant cost to the silicon wafer. Thus, the wafer of the present invention will have a denuded zone and a substantially uniform oxygen concentration as a function of depth from the silicon surface. For example, the wafer will have a uniform concentration of oxygen from the center of the wafer to regions of the wafer which are within about 15 microns of the silicon surface, more preferably from the center of the silicon to regions of the wafer which are within about 10 microns of the silicon surface, even more preferably from the center of the silicon to regions of the wafer which are within about 5 microns of the silicon surface and most preferably from the center of the silicon to regions of the wafer which are within 3 microns of the silicon surface. In this context, substantially uniform oxygen concentration shall mean a variance in the oxygen concentration of no more than about 50%, preferably no more than about 20% and most preferably no more than about 10%. The creation of denuded zones in accordance with the present invention is described in PCT Application No. WO/98/38675 published on Sep. 3, 1998 and incorporated herein be reference.

Figure 4:
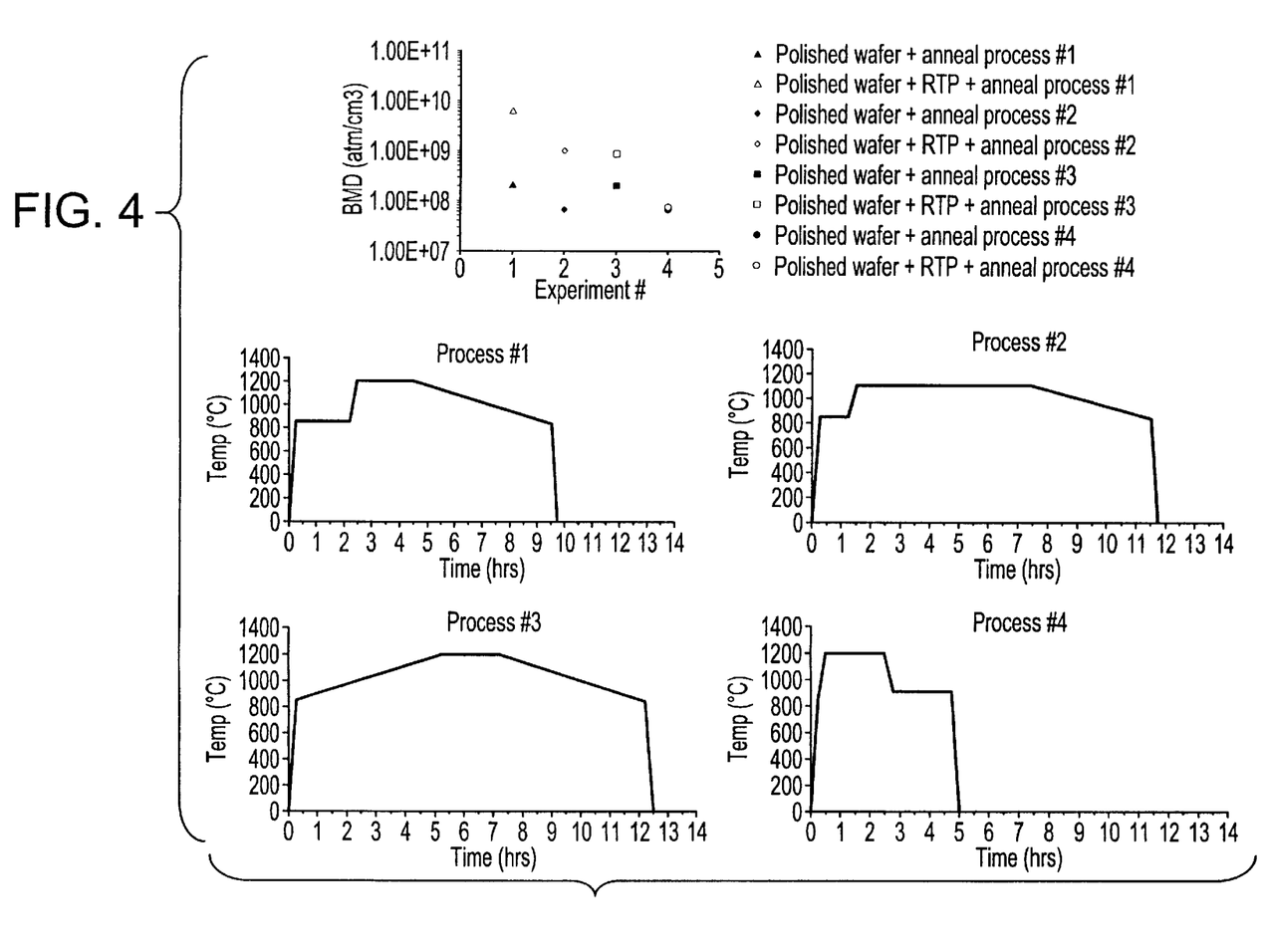
FIG. 4 shows different bulk micro-defect density of wafers that were engineered by adjusting parameters during the high temperature annealing process of the present invention.

In conjunction with the creation of a denuded zone as described above and also in accordance with the present invention, the Bulk Microdefect Density (BMD in atoms/$cm^3$) within the semiconductor wafers can be engineered by adjusting the parameters of the annealing operation (subsequently discussed). Parameters such as ramp up/down rates, hold times and temperatures can be manipulated to establish internal gettering in the wafer bulk to getter unwanted metallic impurities early in the device fabrication process. FIG. 4 shows four different process sequences that could be used to obtain different Bulk Microdefect Densities in the semiconductor wafer.

Figure 3A:
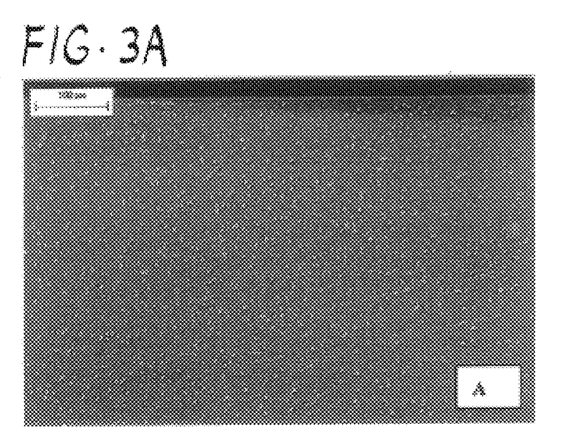
FIG. 3 are photographs of semiconductor wafers oriented with the front surface of the wafer at the top of the photograph at a magnification of 200×.
Figure 3B:
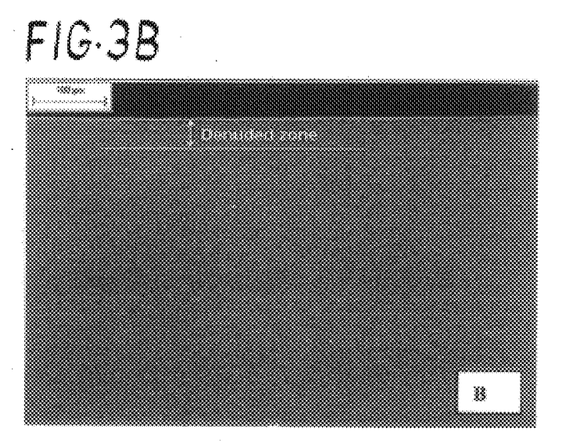
Figure 3C:
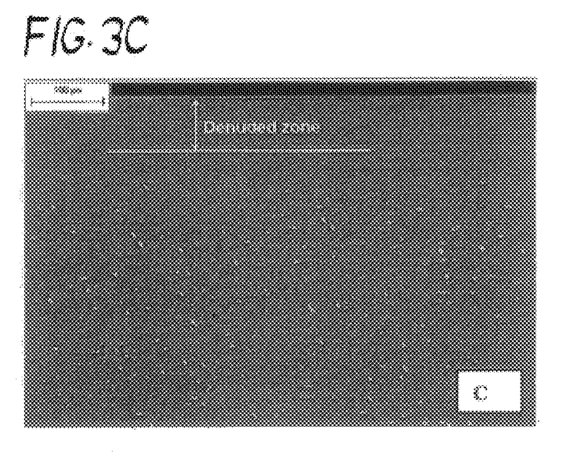

After the micro-etching operation (or optional denuded zone creation operation) is completed, the semiconductor wafer is annealed is a gas ambient to improve the quality of the front surface of the semiconductor wafer and create a denuded zone (if the optional denuded zone processing operation was utilized). During the annealing operation, scratches, surface defects, dislocations, COPs, and OSF nuclei are annealed on the surface and annihilated near the semiconductor surfaces, and a denuded zone, typically between about 30 micrometers to about 100 micrometers from both the front and back surfaces are created if the steps for creating a denuded zone were completed after micro-etching. Out-diffusion of oxygen during the annealing leads to a near surface region that is substantially free of any oxygen related defects. This out-diffusion of oxygen creates a small denuded zone, typically about 20 micrometers deep from the front surface of the semiconductor wafer (in the absence of the optional denuded zone creation operation previously discussed). FIG. 3 shows three photographs of semiconductor wafers at a magnification of 200 times. The photographs shown in FIG. 3 are oriented with the front surface at the top of the photograph. Photograph A shows a standard polished wafer prepared by conventional methods which does not contain a denuded zone. Photograph B shows a wafer prepared in accordance with the present invention without the use of rapid thermal annealing and shows a shallow denuded zone created during the annealing operation of the present invention. Photograph C shows a wafer prepared in accordance with the present invention utilizing the optional rapid thermal annealing steps in combination with the annealing operation and shows a deep denuded zone.

Without being bound to a particular theory, it appears that the high temperature annealing leads to the formation of very shallow dish-like structures at the location of the COPs. The main mechanism of surface flattening appears to be thermally enhanced surface migration of silicon atoms. A similar mechanism helps to smooth over surface defects and scratches and associated dislocations left on the surface after fine grinding and micro-etching. This mechanism allows the front surface of the wafer to be significantly improved without substantial polishing.

The gas ambient utilized during annealing at atmospheric pressure may comprise hydrogen, argon, helium or any combination thereof, with atmosphere being a mixture of hydrogen and argon. The annealing can also be performed in vacuum. The complete annealing process takes from about 4 to about 14 hours. During the complete annealing process, parameters such as ramp up/down times, hold times and temperatures can be adjusted according to the desired BMD density of the wafers being processed. As previously discussed, FIG. 4 shows 4 different processes that can be utilized to achieve different BMD densities.

At some point during the complete annealing process the semiconductor wafer is held for a period of between about 30 seconds and about 2 hours at a temperature of between about 1200° C. and about 1300° C. to improve the quality of the front surface of the wafer in accordance of the present invention. The high temperature annealing process of the present invention may be carried out in commercially available high temperature furnaces which typically process batches of 50 to 150 wafers. Such commercially available furnaces are capable of slowly heating semiconductor wafers from the loading temperatures up to processing temperatures. One such commercially available furnace is the Advance 400 Vertical Furnace available from ASM International (Bilthoven, Netherlands).

Referring now to FIG. 3, there are two maps shown (Map A and Map B) of the front surface of a semiconductor wafer prepared in accordance with the present invention made by a KLA-Tencor 6220 inspection tool (Gain=1). The wafer which is depicted in Map A was inspected after the micro-etching operation of the present invention but prior to the annealing operation of the present invention and shows surface defects uniformly distributed on the wafer surface (surface defects sizes<50 micrometers). Map B is the same wafer as that of Map A that was inspected after the wafer had been subjected to both the micro-etching operation and to the annealing process of the present invention. The defect count between the two maps indicated that 98% of the surface defects present on Map A had been annihilated from the wafer surface during the annealing process in accordance with the present invention.

During annealing, if the semiconductor wafer was subjected to the optional denuded zone creation operation earlier in the process, when the temperature reaches about 800° C. the previously cooled wafer will have separate zones which behave differently with respect to oxygen precipitation. In the high vacancy regions (the wafer bulk), oxygen clusters rapidly as the wafer reaches about 800° C. After a short period of time, the clustering process is finished and a distribution of clusters is reached which depends only upon the initial concentration of vacancies. In the low vacancy regions (near the wafer surfaces), the wafer behaves like a normal wafer which lacks pre-existing oxygen precipitate nucleation centers; that is, oxygen clustering is not observed. As the temperature is increased above 800° C., the clusters in the vacancy rich zone grow into precipitates and are thereby consumed whereas in the vacancy lean zone, nothing happens. By dividing the wafer into various zones of vacancy concentration, a template is effectively created through which is written an oxygen precipitate pattern which is fixed the moment the wafer is loaded into the furnace. The wafer bulk containing the oxygen clusters acts as a gettering sink throughout device manufacturing. FIG. 3 shows a photograph at a magnification of 200× of a semiconductor wafer prepared in accordance with the present invention utilizing the optional denuded zone creation operation. FIG. 3 is oriented with the front surface at the top of the photograph, and it is shown that a substantially free oxygen zone (denuded zone) exists at the front surface and that a substantial amount of oxygen precipitates have formed in the wafer bulk. The oxygen precipitates in the wafer bulk act as a gettering sink for metallic impurities during device manufacturing.

After the annealing process of the present invention is complete, the front surface of the semiconductor wafer has at least about 50% fewer COPs, more preferably at least about 70% fewer COPs, still more preferably at least about 90% fewer COPs, still more preferably at least about 95% fewer COPs, and most preferably at least about 98% fewer COPs than prior to the annealing process. The front surface of the semiconductor wafer, after annealing, has between about 1 and about 10 COPs and surface defects, preferably between about 1 and about 5 COPs and surface defects, and a surface roughness of between about 1 nanometer and about 8 nanometers RMS at a scan length of about 1 millimeter, preferably between about 1 nanometer and about 3 nanometers RMS at a scan length of about 1 millimeter.

After the annealing operation is complete, the semiconductor wafer is "flash" or "final touch" polished to restore a smooth, glossy finish to the front surface of the semiconductor wafer typical for polished wafers. This type of final polish is known to those skilled in the art and generally removes only between about 0.25 micrometers and about 0.5 micrometers of material from the front surface of the semiconductor wafer in a chemical/mechanical polishing process using, for example, a dilute ammonia stabilized colloidal silica slurry and conventional polishing equipment. A preferred ammonia stabilized colloidal silica slurry is Glanzox 3900, which is commercially available from Fujimi Incorporated of Aichi Pref. 452, Japan. Glanzox 3900 has a silica content of from about 8 to about 10% and a particle size of from about 0.025 to about 0.035 µm. If the ammonia stabilized silica slurry is not diluted prior to use, the polished wafer will not be as smooth as a wafer treated with a diluted slurry. A dilution of about one part silica slurry to about 10 parts deionized water is preferred. It will be recognized by one skilled in the art that is the case of production of low cost substrates for epitaxial wafers the final touch polish will not be performed after annealing but instead after epitaxial layer deposition. Also, the final polish may remove between about 0.25 micrometers and about 1 micrometer of material after epitaxial layer deposition.

After the final touch polishing operation is complete, the semiconductor wafer is cleaned using a standard SC-1 and SC-2 wet bench cleaning operation to remove surface contamination. This cleaning operation readies the semiconductor for further device manufacturing and completes the preparation process.

In view of the above, it will be seen that the several objects of the invention are achieved. As various changes could be made in the above-described wafer manufacturing process without departing from the scope of the invention, it is intended that all matter contained in the above description be interpreted as illustrative and not in a limiting sense.

What is claimed is:

1. A process for manufacturing a semiconductor wafer sliced from a single crystal ingot, the semiconductor wafer having a front surface and a back surface, the process comprising:
    annealing the semiconductor wafer in a gas ambient to reduce the surface roughness of the front surface of the wafer, the wafer having a surface roughness of between about 3 nanometer RMS and about 10 nanometers RMS prior to the anneal and a surface roughness of between about 1 nanometer RMS and about 8 nanometers RMS after anneal; and
    flash polishing the front surface of the annealed wafer to create a specular finish on the front surface of the wafer, the flash polishing removing from about 0.25 micrometers to about 0.5 micrometors of material from the front surface of the wafer, said process being free of any wafer material removal steps intermediate the annealing and flash polishing steps.

2. The process as set forth in claim 1 wherein the front surface has a surface roughness of between about 1 nanometer RMS and about 3 nanometers RMS after annealing.

3. The process as set forth in claim 1 wherein prior to the annealing step the front surface of the semiconductor wafer has between about 20 and about 3000 COPs and after the annealing step the front surface of the semiconductor wafer has between about 1 and about 10 COPs.

4. The process as set forth in claim 3 wherein the front surface of the semiconductor wafer has between about 1 and about 5 COPs after the annealing step.

5. The process as set forth in claim 1 wherein after the annealing step the front surface of the semiconductor wafer has at least about 95% fewer COPs than prior to the annealing step.

6. The process as set forth in claim 1 wherein the annealing step comprises annealing the wafer at a temperature of between about 1200° C. and about 1300° C. for a period of time between about 30 seconds and about 2 hours.

7. The process as set forth in claim 1 wherein the flash polishing removes from about 0.25 micrometers to about 1 micrometer of material from the front surface of the wafer.

8. A process for manufacturing a semiconductor wafer sliced from a singlo-crystal ingot, the semiconductor wafer having a front surface and a back surface, the process comprising:
    double side fine grinding the semiconductor wafer to improve the thickness uniformity of the wafer and reduce damage and waviness in the semiconductor wafer;
    micro-etching the front surface of the semiconductor wafer to remove embedded particles and damage on the front surface of the semiconductor wafer and reduce the mechanical stress on both the front and back semiconductor wafer surfaces which result from double side fine grinding, said front surface having a surface roughness of between about 3 nanometers RMS and about 10 nanometers RMS after the micro-etching;
    annealing the semiconductor wafer in a gas ambient to improve the quality of the front surface of the semiconductor wafer, said front surface having a surface roughness of between about 1 nanometer RMS and about 8 nanometers after annealing; and
    flash polishing the front surface of the annealed wafer to create a specular finish on the front surface of the wafer, the flash polishing removing from about 0.25 micrometers to about 0.5 micrometers of material from the front surface of the wafer, said process being free of any wafer material removal steps intermediate the annealing and flash polishing steps.

9. The process as set forth in claim 8 wherein between about 10 and about 90 micrometers of total wafer thickness is removed during the double side fine grinding operation.

10. The process as set forth in claim 8 wherein an aqueous solution of hydrofluoric acid and an oxidizing agent is used as the etchant during the micro-etching operation.

11. The process as set forth in claim 8 wherein the oxidizing agent is selected from the group consisting of magnesium and chromium based oxidizing agents.

12. The process as get forth in claim 8 wherein the oxidizing agent is selected form the group consisting of potassium permanganate and sodium permanganate.

13. The process as set forth in claim 8 wherein the gas ambient utilized in the annealing operation is selected from the group consisting of hydrogen, argon, helium, or any combination thereof.

14. The process as set forth in claim 8 wherein the semiconductor wafer is annealed for a period of between about 4 hours and about 12 hours.

15. The process as set forth in claim 8 wherein the semiconductor wafer is annealed in a gas ambient selected from the group consisting of hydrogen, argon, helium, or any combination thereof for a period of between about 4 hours and about 14 hours such that at some point during annealing the wafer is held for between about 30 seconds and about 2 hours at a temperature of between about 1200° C. and about 1300° C.

16. The process as set forth in claim 8 wherein after the micro-etching step the front surface of the wafer has between about 20 COPs and about 3000 COPs and between about 1 COP and about 10 COPs after the annealing step.

17. The process as set forth in claim 8 wherein the semiconductor wafer is subjected to an operation after the micro-etching operation such that denuded zones in the semiconductor wafer are created during the annealing operation.

18. The process as set forth in claim 8 wherein the depth of the denuded zones in the semiconductor wafer is at least about 20 micrometers.

19. The process as set forth in claim 8 wherein the flash polishing step removes from about 0.25 micrometers to 1 micrometer of material from the front surface of the water.

20. A process for manufacturing a semiconductor wafer sliced from a single-crystal ingot, the semiconductor wafer having a front surface and a back surface, the process comprising;

slicing a semiconductor wafer from a single crystal ingot;

performing a lapping/rough grinding operation on the semiconductor wafer to reduce waviness and improve flatness in the semiconductor wafer;

double side fine grinding the semiconductor wafer to improve the thickness uniformity of the wafer and reduce damage and waviness in the semiconductor wafer;

micro-etching the front surface of the semiconductor wafer to remove embedded particles and damage on the front surface of the semiconductor wafer and reduce the mechanical stress on both the front and back surfaces left from double side fine grinding;

performing an operation on the semiconductor wafer such that a denuded zone is created in the semiconductor wafer during subsequent manufacturing;

annealing the semiconductor wafer in a gas ambient to improve the quality of the front surface of the semiconductor wafer, the front surface having from about 1 to about 10 COPs and a surface roughness of from about 1 nanometer EMS and about 8 nanometers EMS after the annealing; and flash polishing the front surface of the annealed wafer to create a specular finish on the front surface of the wafer, the flash polishing removing from about 0.25 micrometers to about 0.5 micrometers of material from the front surface of the wafer, said process being free of any wafer material removal steps intermediate the annealing and flash polishing steps.

21. The process as set forth in claim 20 wherein the flash polishing removes from about 0.25 micrometers to about 1 micrometer of material from the front surface of the wafer.

* * * * *

UNITED STATES PATENT AND TRADEMARK OFFICE
CERTIFICATE OF CORRECTION

PATENT NO. : 6,376,395 B2
DATED : April 23, 2002
INVENTOR(S) : Jiri L. Vasat, Andrei Stefanescu and Thomas M. Hanley It is certified that error appears in the above-identified patent and that said Letters Patent is hereby corrected as shown below:

Column 12,
Line 27, "singlo-crystal ingot," should read -- single-crystal ingot, --.

Column 14,
Line 19, "nanomether EMS" (both instances) should read -- nanometer RMS --.

Signed and Sealed this

First Day of April, 2003

JAMES E. ROGAN
*Director of the United States Patent and Trademark Office*